United States Patent
Lin et al.

(10) Patent No.: US 8,269,230 B2
(45) Date of Patent: Sep. 18, 2012

(54) MULTILAYER-DOPED ORGANIC LIGHT EMITTING DIODE STRUCTURE

(75) Inventors: Jian-Yang Lin, Yunlin County (TW);
Pei-Wei Hung, Yunlin County (TW)

(73) Assignee: National Yunlin University of Science and Technology, Yunlin County (TW)

( * ) Notice: Subject to any disclaimer, the term of this patent is extended or adjusted under 35 U.S.C. 154(b) by 26 days.

(21) Appl. No.: 12/970,317

(22) Filed: Dec. 16, 2010

(65) Prior Publication Data

US 2012/0153324 A1    Jun. 21, 2012

(51) Int. Cl.
*H01L 29/18* (2006.01)

(52) U.S. Cl. .......... 257/88; 257/98; 257/E31.099; 257/E31.105

(58) Field of Classification Search .......... 257/88, 257/89, 98, 101, 102, E25.032, E31.099, 257/E31.105
See application file for complete search history.

(56) References Cited

U.S. PATENT DOCUMENTS

2006/0246315 A1 * 11/2006 Begley et al. .......... 428/690
2007/0126347 A1 *  6/2007 Jarikov et al. .......... 313/506

FOREIGN PATENT DOCUMENTS

| TW | 520612  | 11/2001 |
| TW | I236174 | 8/2004  |

* cited by examiner

*Primary Examiner* — Brook Kebede
(74) *Attorney, Agent, or Firm* — Muncy, Geissler, Olds & Lowe, PLLC

(57) ABSTRACT

A multilayer-doped OLED structure comprises a substrate, an anode layer, a hole transport layer, a multilayer-doped organic light emitting layer, an electron transport layer, an electron injection layer and a metallic cathode layer. The multilayer-doped organic light emitting layer functions as a lighting source. The multilayer-doped organic light emitting layer is fabricated by a plurality of film deposition and doping processes. Thereby, the multilayer-doped organic light emitting layer has better quantum effect to improve luminous efficiency and illumination of OLED.

4 Claims, 2 Drawing Sheets

MULTILAYER-DOPED ORGANIC LIGHT EMITTING DIODE STRUCTURE

FIELD OF THE INVENTION

The present invention relates to an organic light emitting diode (OLED) structure, particularly to an OLED structure with high quantum efficiency.

BACKGROUND OF THE INVENTION

OLED (Organic Light Emitting Diode) features self-luminescence, slimness, fast response, wide visual angle, high resolution, high illumination, applicability to flexible displays, and adaptability to a wide range of temperature. Therefore, it is regarded as the new-generation display device to replace TFT-LCD (Thin Film Transistor Liquid Crystal Display). In OLED, the recombination of electrons and holes in the light emitting layer generates energy to excite the light emitting molecules from the ground state to the excited state. When the electrons back from the excited state to the ground state, excess energy is released in form of light waves. Thereby are obtained light emitting elements with different wavelengths.

So far, many patents have been proposed to improve the luminous efficiency of the light emitting layer of OLED. A R.O.C. patent No. I236174 disclosed an organic-inorganic light emitting diode structure, which comprises a substrate, a first electrode on the substrate, an organic-inorganic light emitting layer on the first electrode, and a second electrode on the organic-inorganic light emitting layer. The organic-inorganic light emitting layer contains a plurality of organic-inorganic composite quantum dots dispersed in a high polymer. Each organic-inorganic composite quantum dot includes a ZnX quantum dot and an organic molecule coating the surface of the quantum dot, wherein X is selected from a group consisting of S, Se, Te, and a combination thereof.

A R.O.C. patent No. 520612 disclosed an organic light emitting device, which comprises a substrate, an anodic electrode and a cathodic electrode on the substrate, and a light emitting layer between the anodic electrode and the cathodic electrode. The light emitting layer includes a primary agent and at least one blending agent. The primary agent contains an organic solid-state material having at least two compounds. The first compound is essentially non-polarity and able to transmit electrons and holes. The second compound is an organic compound having polarity greater than the first compound. The blending agent is selected from a material able to emit light from the light emitting device.

From the above description, it is known that promoting the luminous efficiency of OLED is an important subject in the field. Nevertheless, how to achieve the high luminous efficiency at the lower cost is still a challenge for the researchers.

SUMMARY OF THE INVENTION

The primary objective of the present invention is to provide an OLED with high luminous efficiency to satisfy the requirement for high illumination.

The present invention proposes a multilayer-doped OLED structure, which comprises a substrate, an anode layer, a hole transport layer, a multilayer-doped organic light emitting layer, an electron transport layer, an electron injection layer and a metallic cathode layer. The anode layer is arranged on the substrate. The hole transport layer is arranged on the anode layer. The multilayer-doped organic light emitting layer is arranged on the hole transport layer and fabricated by a plurality of film deposition and doping processes. The electron transport layer is arranged on the multilayer-doped organic light emitting layer. The electron injection layer is arranged on the electron transport layer. The metallic cathode layer is arranged on the electron injection layer.

Thereby is formed the multilayer-doped OLED structure. As the multilayer-doped organic light emitting layer has better quantum efficiency, the OLED structure of the present invention has higher luminous efficiency and higher illumination.

DETAILED DESCRIPTION OF THE PREFERRED EMBODIMENTS

The technical contents of the present invention are described in detail in cooperation with the drawings below.

Figure 1:
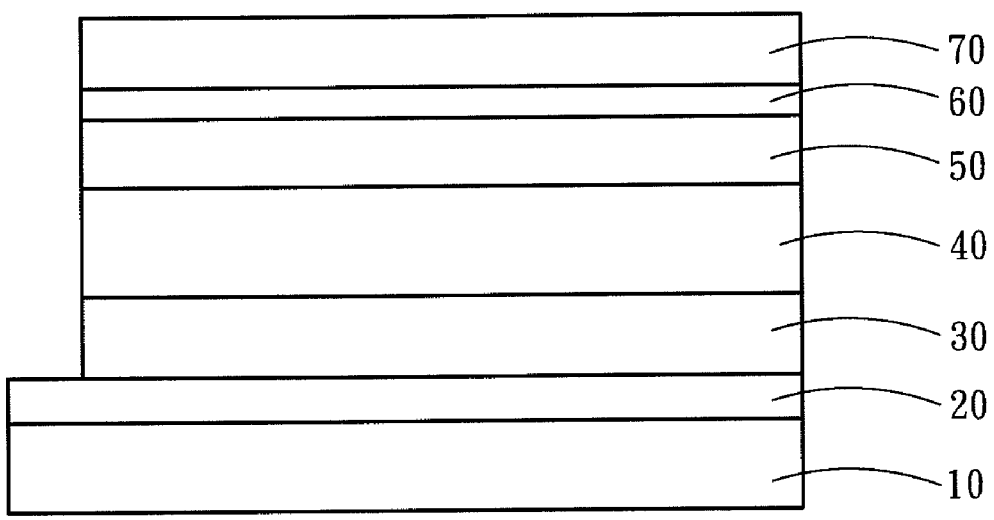
FIG. 1 is a diagram schematically showing a multilayer-doped OLED structure according to one embodiment of the present invention.

Refer to FIG. 1. The multilayer-doped OLED structure of the present invention comprises a substrate 10, an anode layer 20, a hole transport layer 30, a multilayer-doped organic light emitting layer 40, an electron transport layer 50, an electron injection layer 60 and a metallic cathode layer 70. The substrate 10 is made of a material selected from a group consisting of glasses, polymers, ceramics and metals. The anode layer 20 is arranged on the substrate 10. The hole transport layer 30 is arranged on the anode layer 20. The multilayer-doped organic light emitting layer 40 is arranged on the hole transport layer 30 and is fabricated by a plurality of film deposition and doping processes. The electron transport layer 50 is arranged on the multilayer-doped organic light emitting layer 40. The electron injection layer 60 is arranged on the electron transport layer 50. The metallic cathode layer 70 is arranged on the electron injection layer 60.

Figure 2:
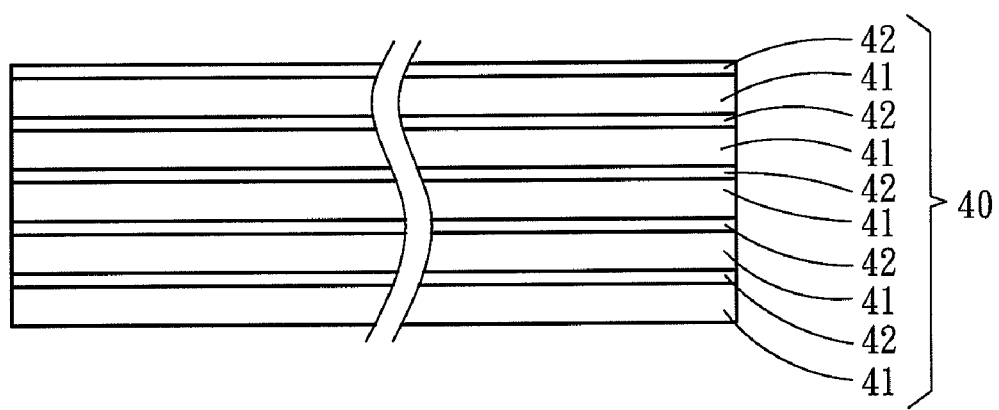
FIG. 2 is a diagram schematically showing a multilayer-doped organic light emitting layer according to one embodiment of the present invention.

The multilayer-doped organic light emitting layer 40 is preferably fabricated by 3-15 times of film deposition processes. The multilayer-doped organic light emitting layer 40 is preferred formed at a thickness of 10-120 nm. Refer to FIG. 2. The multilayer-doped organic light emitting layer 40 is formed by co-evaporating host emitters 41 and guest emitters 42 in an intermittent doping manner. The host emitter 41 and guest emitter 42 are made of a combination of a host fluorescent material and a doped guest fluorescent material, a combination of a host fluorescent material and a doped guest phosphorescent material, a combination of a host phosphorescent material and a doped guest phosphorescent material, or a combination of a host phosphorescent material and a doped guest fluorescent material.

Below, an embodiment is used to exemplify the present invention. In this embodiment, the multilayer-doped organic light emitting layer 40 emits white light. The host emitter 41 and guest emitter 42 are made of a combination of a blue host fluorescent material and a doped yellow guest fluorescent material. The blue host fluorescent material is TBADN (2-Tert-butyl-9,10-di(naphth-2-yl)anthracene). The yellow guest fluorescent material is Rubrene ((5,6,11,12)-Tetraphenylnaphthacene). In the multilayer-doped organic light emitting layer 40, each of the host emitters 41, which is made of the blue host fluorescent material TBADN, has a thickness of 4 nm; each of the guest emitters 42, which is TBADN doped with the yellow guest fluorescent material Rubrene, has a thickness of 1 nm. The doping concentration of Rubrene is 13%. In this embodiment, the host emitters 41 and the guest emitters 42 are fabricated by 6 times of the co-evaporation processes to form the multilayer-doped organic light emitting layer 40 with a total thickness of 30 nm.

In conclusion, the multilayer-doped organic light emitting layer 40 of the present invention is fabricated by intermittently doping the host emitters 41 and the guest emitters 42 to promote the quantum effect, thereby are achieved high luminous efficiency and high illumination of OLED.

The embodiments described above are only to exemplify the present invention but not to limit the scope of the present invention. Any equivalent modification or variation according to the spirit of the present invention is to be also included within the scope of the present invention.

What is claimed is:

1. A multilayer-doped organic light emitting diode structure, comprising:
    a substrate;
    an anode layer arranged on the substrate;
    a hole transport layer arranged on the anode layer;
    a multilayer-doped organic light emitting layer arranged on the hole transport layer and fabricated by a plurality of film deposition and doping processes, wherein the multilayer-doped organic light emitting layer is fabricated by co-evaporating host emitters and guest emitters in an intermittent doping manner, and wherein the multilayer-doped organic light emitting layer emits white light and includes a blue host fluorescent material TBADN (2-Tert-butyl-9, 10-di(naphth-2-yl)anthracene) and a yellow guest fluorescent material Rubrene ((5, 6, 11, 12)-Tetraphenylnaphthacene), and wherein each of the host emitters, which is made of the blue host fluorescent material TBADN, has a thickness of 4 nm; and each of the guest emitters, which is the blue host fluorescent material TBADN doped with the yellow guest fluorescent material Rubrene, has a thickness of 1 nm; wherein the Rubrene has a doping concentration of 13%; the host emitters and the guest emitters being fabricated by 6 times of co-evaporation processes to form the multilayer-doped organic light emitting layer with a total thickness of 30 nm;
    an electron transport layer arranged on the multilayer-doped organic light emitting layer;
    an electron injection layer arranged on the electron transport layer; and
    a metallic cathode layer arranged on the electron injection layer.

2. The multilayer-doped organic light emitting diode structure according to claim 1, wherein the multilayer-doped organic light emitting layer is fabricated by 3-15 times of film deposition processes.

3. The multilayer-doped organic light emitting diode structure according to claim 1, wherein the multilayer-doped organic light emitting layer is formed at a thickness of 10-120 nm.

4. The multilayer-doped organic light emitting diode structure according to claim 1, wherein the substrate is made of a material selected from a group consisting of glasses, polymers, ceramics and metals.

* * * * *